United States Patent [19]

Brown et al.

[11] 4,140,909
[45] Feb. 20, 1979

[54] RADIATION DETECTOR

[75] Inventors: Dale M. Brown; Marvin Garfinkel, both of Schenectady, N.Y.

[73] Assignee: General Electric Company, Schenectady, N.Y.

[21] Appl. No.: 861,674

[22] Filed: Dec. 19, 1977

[51] Int. Cl.² ........................... G01T 1/22; G01T 1/24
[52] U.S. Cl. .................................................. 250/370
[58] Field of Search .................. 250/370, 371; 357/29, 357/30

[56] References Cited

U.S. PATENT DOCUMENTS

| 3,418,473 | 12/1968 | Blue | 250/370 |
| 3,864,722 | 2/1975 | Carnes | 250/370 |

Primary Examiner—Bruce C. Anderson
Attorney, Agent, or Firm—Julius J. Zaskalicky; Joseph T. Cohen; Marvin Snyder

[57] ABSTRACT

A layer of transparent conductive material insulatingly overlies a major surface of a substrate of semiconductor material to provide a CIS (conductor-insulator-semiconductor) capacitor. A region of opposite conductivity type is provided in the substrate adjacent the major surface of the substrate. The capacitor is biased in accumulation and the region of opposite conductivity type is reversely biased with respect to the substrate. Minority charge carriers generated in the semiconductor substrate underlying the conductive layer in response to applied radiation diffuse to the region of opposite conductivity type and are sensed.

9 Claims, 4 Drawing Figures

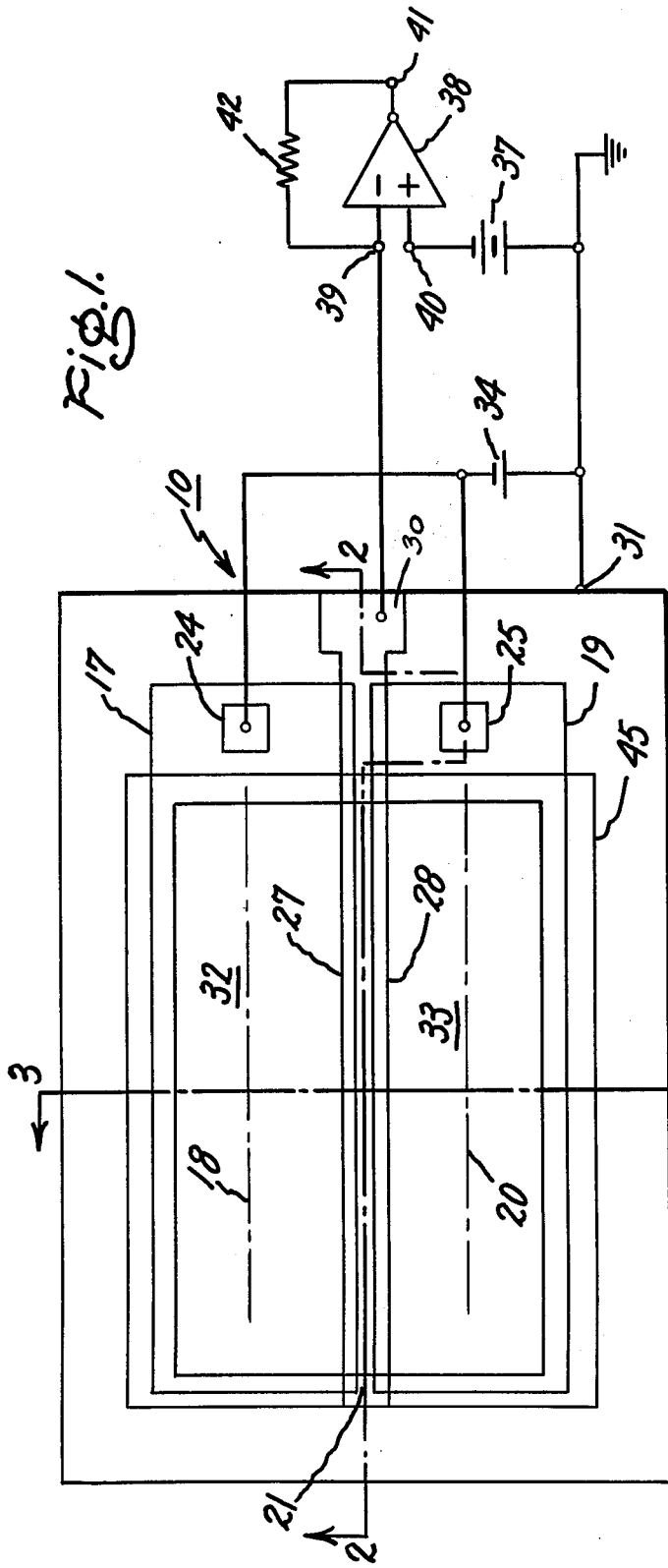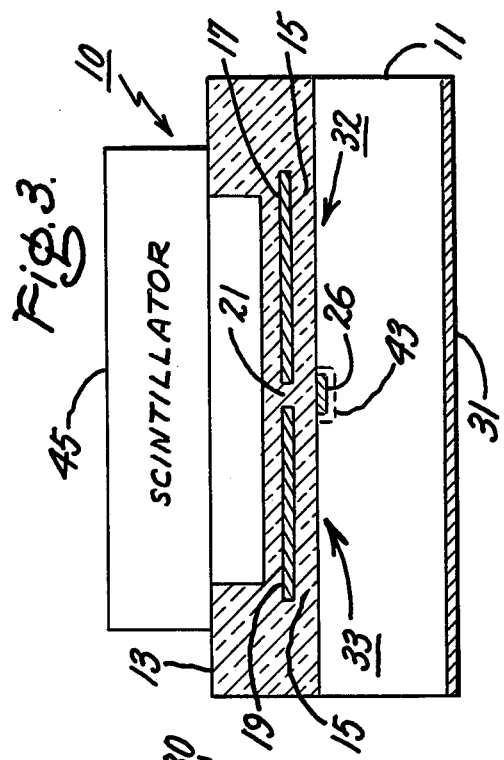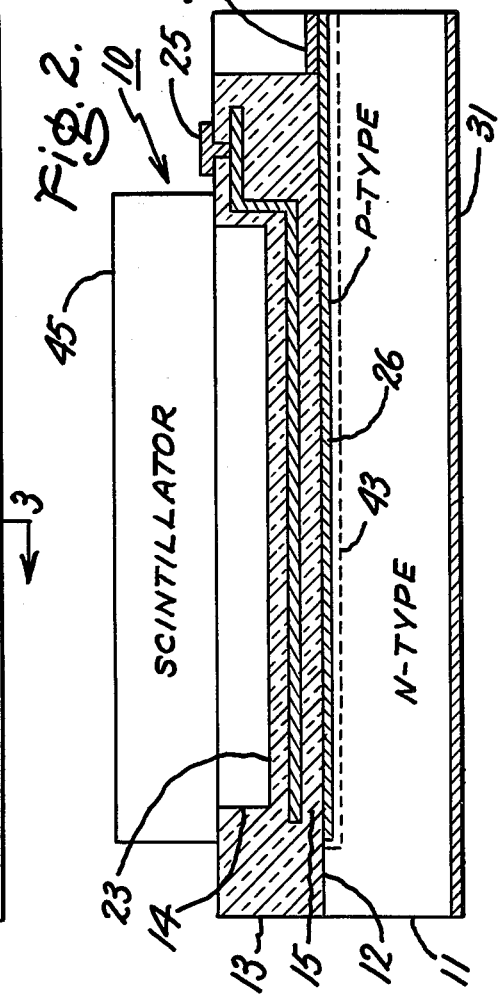

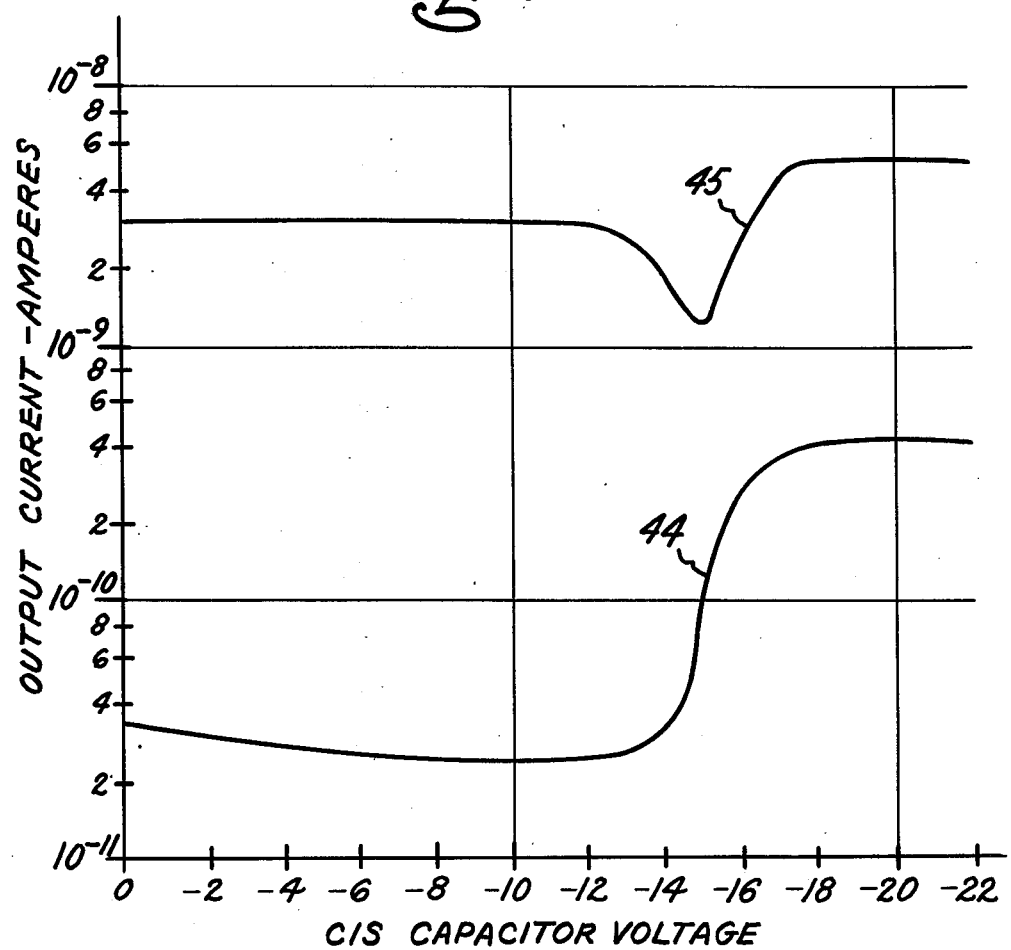

RADIATION DETECTOR

The present invention relates in general to radiation detecting devices and in particular to such devices for converting radiation in the form of X-rays and light into electrical signals.

The present invention is an improvement over the invention described and claimed in copending patent application, Ser. No. 807,080, filed June 16, 1977, now U.S. Pat. No. 4,101,924 and assigned to the assignee of the present invention.

An object of the present invention is to provide a radiation detector of high collection efficiency.

Another object of the present invention is to provide a radiation detector having high sensitivity to radiation yet providing low output capacitance for electrical signals.

A further object of the present invention is to provide a radiation detector of enhanced signal to noise ratio.

In carrying out the invention in an illustrative embodiment thereof, there is provided a substrate of semiconductor material of one conductivity type. A first layer of a transparent insulating material is provided overlying a major surface of the semiconductor substrate. A second layer of a transparent conductive material overlies the first layer and forms a capacitor with the substrate and the first layer. A region of opposite conductivity type is provided in the substrate contiguous to the surface adjacent region of the substrate underlying said layer of transparent conductive material. The area of the second layer of transparent conductive material is substantially larger than the area of the region of opposite conductivity type in the major surface of the substrate. Means are provided for applying a biasing voltage between the second layer and the substrate to establish a region of accumulation in the surface of the substrate underlying the second layer. Output means are connected in circuit with the PN junction for sensing the flow of minority carrier charge generated in the substrate.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 1 is a plan view of a radiation sensing device in accordance with the present invention;

FIG. 2 is a sectional view of the device of FIG. 1 taken along section lines 2—2 showing the internal construction thereof;

FIG. 3 is another sectional view of the device of FIG. 1 taken along section lines 3—3 also showing the internal construction thereof;

FIG. 4 shows graphs of current versus voltage useful in describing the device of FIGS. 1–3.

Referring now to FIGS. 1, 2 and 3 there is shown a radiation sensing device 10 including a substrate 11 of monocrystalline silicon semiconductor material of N-type conductivity and relatively high resistivity, for example 10 ohm centimeters. A thick layer 13 of insulation, such as silicon dioxide, is formed on a major surface 12 of the substrate. The substrate 11 may conveniently be 10 mils thick and the layer of thick insulation may be 1 micron thick. An elongated rectangular recess 14 is formed in the thick insulating layer extending to within a short distance of the major surface of the semiconductor substrate 11 to provide a thin layer of insulation, for example, 0.1 microns thick, over the major surface. Overlying substantially one-half of the recess 14 and also extending over an adjacent portion of the thick layer of insulation is transparent conductive member 17. The longitudinal axis 18 of the conductive member 17 is parallel to the long dimension of the recess 14. Overlying substantially the other half of the recess 14 and also extending over an adjacent portion of the thick insulation is another conductive member 19 having a longitudinal axis 20 parallel to the long dimension of the recess 14. Adjacent edges of the elongated conductive members 17 and 19 are spaced apart to form a narrow gap 21 having a longitudinal axis parallel to the long dimension of the recess 14. The conductive members 17 and 19 are constituted of a transparent conductive material such as antimony tin oxide, indium tin oxide, or tin oxide. The conductive members 17 and 19 may also be constituted of thin layers of metal, for example molybdenum approximately 10 Angstroms thick. A thin layer 23 of silicon dioxide is formed over the transparent electrodes 17 and 19 to provide protection for the electrodes. Terminals 24 and 25 provide electrical connection to the conductive members 17 and 19, respectively. Also provided in the semiconductor substrate is an elongated region 26 of P-type conductivity having a longitudinal axis parallel to the long dimension of the recess 14. The P-type region 26 underlies the gap 21 with one edge 27 underlying electrode 17 and the other longitudinal edge 28 underlying conductive member 19. Preferably, the edge 27 underlies the adjacent edge of transparent conductive member 17, and edge 28 underlies the adjacent edge of transparent conductive member 19 to keep capacitive coupling between the conductive members 17, 19 and P-type region 26 to a minimum. Terminal 30 provides conductive connection to the P-type region 26. Terminal 31 secured to the bottom surface of the substrate 11 provides conductive connection thereto. The elements 17, 15 and 11 constitute a first CIS (conductor-insulator-semiconductor) capacitance 32 and the elements 19, 15 and 11 constitute a second CIS capacitance 33.

FIG. 1 also shows a circuit for operating the device 10. The circuit includes a bias source 34 having the positive terminal thereof connected to ground and to the substrate terminal 31 and having the negative terminal thereof connected to terminals 24 and 25. The source 34 biases the CIS capacitances 32 and 33 in accumulation (i.e. the voltage at which minority carriers generated in the substrate are repelled from the surface. Such a bias causes minority carriers generated in the substrate to be repelled away from the surface of the substrate and thus maintains collection efficiency in the substrate underlying electrodes 17 and 19. Bias potential for the P-type region 26 is provided by the bias source 37 and high gain differential amplifier 38. The differential amplifier 38 includes an inverting terminal 39, a noninverting terminal 40, and an output terminal 41. The positive terminal of the source 37 is connected to ground and the negative terminal thereof is connected to the noninverting terminal 40. The inverting terminal 39 is connected to the terminal 30 for the P-type region 26. A feedback resistance 42 is connected between the output terminal 41 and the noninverting terminal 39. The high gain differential amplifier 39 with resistive feedback functions to maintain the differential in voltage between the inverting terminal 39 and the noninverting terminal 40 close to zero. The negative potential of source 37 appears on the P-type region 36 and establishes a depletion region 43 in the substrate, as shown in FIGS. 2 and 3. The absolute value of the potential of source 37 is greater than the absolute value of the voltage of source 34. Thus, the absolute value of the potential of the diffused region 26 is greater than the absolute value of the surface potential of the substrate underlying the conductive members 17 and 18. Any minority charge generated in the surface adjacent regions of the substrate underlying electrodes 17 and 19 as a result of incident radiation or from thermal excitation flows into the P-type region 26 and to the terminal 39. As terminals 39 and 40 are maintained at the same potential as a consequence of the action of the amplifier 38, the charge generated in the surface adjacent regions of the substrate underlying electrodes 17 and 19 flows through the resistor 42 to the output terminal 41. Thus, the potential on the terminal 41 is proportional to the radiation induced current flow through the resistance 42.

The device of both the present invention and the device of aforementioned patent application Ser. No. 807,080 have the advantage that the charge generation function and the charge sensing function are separated. The areas of the transparent conductive members 17 and 19 in both devices may be made very large in relation to the surface area of the P-type region 26, for example 100 times, to provide high sensitivity while the area of the P-type region 26 may be kept quite small to provide low output capacitance and hence high voltage output in relation to photon input. By utilizing high values of reverse bias on the P-type region, the capacitance of this region may be further reduced and hence the sensitivity of the detector further improved.

The device of the present application has the additional advantage that by operating the CIS capacitors 32 and 33 below threshold voltage and in accumulation rather than above threshold voltage the signal to noise ratio of the device is substantially increased, as will be apparent from a consideration of FIG. 4 to which reference is now made. FIG. 4 shows a pair of graphs 44 and 45 of current flowing in the line between terminal 39 and terminal 39 as a function of various voltages applied across the CIS capacitors 32 and 33 for a device constituted of silicon semi-conductor material of a resistivity of 10 ohm centimeters, having an oxide thickness of 0.1 microns and having an aggregate transparent electrode area of 4 square millimeters. The minority carrier lifetime in the semiconductor material was approximately 20 micro-seconds. Graph 44 shows the manner in which the current varies as the voltage on the transparent electrodes is increased in the negative direction in the absence of applied radiation, i.e. dark current. As the voltage on the transparent electrode 17 and 19 is increased from zero volts, dark current decreases slightly from a value of $3 \times 10^{-11}$ amperes to a value of about $2.5 \times 10^{-11}$ at just below threshold voltage (about $-14$ volts). As the voltage is increased beyond threshold voltage, the dark current increases very rapidly until it reaches a saturation value of about $4 \times 10^{-10}$ amperes. Thus, operating the device below threshold and in accumulation reduces the dark current by a factor of 16. As noise is proportional to the square root of the dark current, noise is reduced by a factor of 4. Graph 45 shows output current including signal and dark current components of the same device as a function of bias voltage applied across the CIS capacitors 32 and 33 while light of constant power of a particular value and a particular wavelength (5000 Angstroms) is directed through the transparent electrodes 32 and 33 onto the surface of the semiconductor substrate. At zero bias voltage, the output current is about $3 \times 10^{-9}$ amperes. As the bias voltage on the transparent electrodes 17 and 19 is increased in the negative direction, the output current remains substantially constant until a voltage close to threshold voltage, nominally 14 volts, is reached at which time the output current decreases to a value $1.25 \times 10^{-9}$ amperes at threshold and thereafter increases to a saturation value above threshold of 4.8 $10^{-9}$ amperes. Thus, below threshold the signal component of current is $2.75 \times 10^{-9}$ ($3 \times 10^{-9}$ minus $0.25 \times 10^{-9}$) and at a voltage above threshold the signal component of output current is $4.5 \times 10^{-9}$ ($4.9 \times 10^{-9}$ minus $4 \times 10^{-10}$). Thus, the decrease in the signal component of current in operating the device below threshold over that in operating it above threshold is 1.7. Accordingly, the signal to noise ratio improvement in operating the device in the accumulation mode, i.e. below threshold over that of operating it above threshold is improved by the ratio of 4 divided by 1.7 or 2.3. For wavelengths of visible radiation in the range of 4,000 to 9,000 Angstroms and of the same constant power, graphs similar to graph 45 were obtained from which the same 2.3 to 1 improvement in signal to noise ratio was obtained.

For the utilization of the device to detect radiation to which the semiconductor is transparent such as, for example, X-rays, suitable conversion means for converting X-rays to light to which the semiconductive material is more responsive is provided. To this end, in FIGS. 1, 2 and 3 is shown a scintillator 45 suitable for the conversion of X-rays into visible light to which silicon is responsive. The scintillator 45 may be constituted of a material such as cesium iodide.

In the detector of the present invention, charge carriers generated in the surface adjacent regions of the semiconductor substrate underlying electrodes 17 and 19 move by diffusion to the output region 26 where they may be stored or read out. The time to travel from the point of generation to the output region is a function of the square of the distance between the point of generation and the output region. Thus, the speed of response of the detector is a function of the size of the charge generation region underlying the transparent electrodes along the surface in relation to the output region of opposite conductivity. The speed of response is also a function of the location of the output region in relation to the charge generation region. In the detector described in connection with FIGS. 1-3, the provision of elongated conductive members 17 and 19 and an elongated region 26 of opposite conductivity type underlying both electrodes 17 and 19 keeps the distance that carriers generated in the depletion regions must travel to reach the output region 26 to a minimum, and thus provides a high speed of response. This high speed of response is at the expense of some decrease in sensitivity due to increased area of the output PN junction. A number of electrically connected elongated regions of opposite conductivity type may be provided on a common substrate, each with its pair of associated elongated conductive members to enhance the speed of response. The number and spacing of such elongated regions is chosen so as to obtain the desired speed of response.

A particular advantageous organization of materials for the detector of the present invention comprises a substrate of silicon, an insulating layer of silicon dioxide overlying the substrate and a thin layer of a metal, for example, a layer of molybdenum about 10 Angstroms thick. The thin layer of metal passes radiation over a broad band from deep in the ultraviolet portion of spectrum to well into the infra-red portion of the spectrum. The silicon dioxide has a band gap of about 10.5 electron volts and hence would also transmit radiation from deep in the ultraviolet portion of the spectrum well into the infra-red portion of the spectrum. Thus, the detector response would be determined primarily by the response of the silicon substrate. As pointed out below this response in terms of quantum efficiency as a function of wavelength would be excellent from deep in the ultraviolet portion of the spectrum into the short wavelength part of the infra-red portion of the spectrum.

While the invention has been described in connection with devices made of silicon semiconductor material, it is understood that the invention is equally applicable to devices made of other semiconductor materials, such as germanium, gallium phosphide and gallium arsenide.

While the invention has been described in connection with devices constituted of a semiconductor substrate of N-type conductivity with a P-type output region, it will be understood that P-type substrates with an N-type output region could as well be used. In such a case, the applied potentials would be reversed in polarity.

While in the circuit of FIG. 1, the P-region 26 was operated with reverse bias, it will be understood that the P-region 26 may be operated with zero bias with respect to the substrate. Elimination of the source 37 would provide such a circuit. Other output circuits may be utilized with the device of FIG. 1, for example, the output circuit described and claimed in patent application Ser. No. 846,543, filed Oct. 28, 1977, and assigned to the assignee as the present invention.

While a pair of separate electrodes 17 and 19 were utilized in the device of FIG. 1, it will be understood that a single electrode could have been provided in the recess 14 and overlying the P-type region 26 as well as the N-type substrate with some advantage in simplicity of fabrication. Such a device, however, would have increased output capacitance.

The detector of the present invention is particularly advantageous over PN junction detectors. In the detector of the present invention the region in which charge generation occurs can be made very large in relation to the size of the region of opposite conductivity type with greatly increased sensitivity of the detector, as pointed out above. Also, in the detector of the present invention the region in which charge generation occurs extends to the surface of the semiconductor substrate. Thus, charge carriers which are generated near the surface of the substrate by radiation in the blue and ultraviolet portions of the spectrum are substantially all collected with resultant high efficiency of conversion of radiation into electrical signal. In PN junction detectors, the PN junction is located below the surface of the semiconductor substrate. Carriers generated at the surface of the substrate in response to radiation must travel through heavily doped surface adjacent regions of the substrate to the PN junction to be detected. A large proportion of the carriers generated at the surface recombine both at the surface and in the bulk of the substrate before they reach the PN junction with resultant lower efficiency of conversion of radiation into electrical signal.

While the invention has been described in specific embodiments, it would be understood that modifications may be made by those skilled in the art and it is intended by the appended claims to cover all such modifications and changes as fall within the true spirit and scope of the invention.

We claim:

1. A radiation sensing device comprising
a substrate of monocrystalline semiconductor material of one conductivity type,
a first layer of a transparent insulating material overlying a major surface of said substrate,
a second layer of a transparent conductive material overlying said first layer and forming a first capacitor with said substrate and said first layer,
a region of opposite conductivity type in said substrate adjacent said major surface forming a PN junction therewith, said PN junction having a first edge in said major surface and underlying said second layer of transparent conductive material, the area of said region of opposite conductivity type in said major surface being substantially smaller than the area of said second layer of transparent conductive material,
means for applying a biasing voltage between said second layer and said substrate to establish a region of accumulation in the surface of said substrate underlying said second layer,
means connected in circuit with said PN junction for sensing the flow of minority carrier charge generated in said substrate.

2. The device of claim 1 in which said output means includes means for reversely biasing said PN junction.

3. The device of claim 1 in which said output means includes means for zero biasing said PN junction.

4. The device of claim 1 in which both said second layer and said region of opposite conductivity type are of elongated configurations and on which said first edge of said PN junction is substantially linear and substantially parallel to the longituinal axis of said second layer.

5. The device of claim 4 in which a third layer of a transparent conductive material and of elongated configuration overlies said first layer and forms a second capacitor with said substrate and said first layer, in which said PN junction has a second substantially linear edge, said second linear edge underlying said third layer of transparent conductive material and being substantially parallel to the longitudinal axis of said third layer.

6. The device of claim 1 in which said semiconductor material is silicon.

7. The device of claim 1 in which said transparent conductive material is selected from the class consisting of tin oxide, indium tin oxide, and antimony tin oxide.

8. The device of claim 1 in which said second layer is a thin transparent layer of a metal.

9. The device of claim 1 in which a scintillator overlies said second layer of transparent conductive material.

* * * * *